US012713631B2

(12) United States Patent
Moore et al.

(10) Patent No.: US 12,713,631 B2
(45) Date of Patent: Aug. 18, 2026

(54) THREE-DIMENSIONAL INTEGRATED CIRCUIT RESISTORS

(71) Applicant: Murata Manufacturing Co., Ltd., Kyoto (JP)

(72) Inventors: Jarred Moore, San Diego, CA (US); Sinan Goktepeli, Austin, TX (US)

(73) Assignee: MURATA MANUFACTURING CO., LTD., Kyoto (JP)

( * ) Notice: Subject to any disclaimer, the term of this patent is extended or adjusted under 35 U.S.C. 154(b) by 614 days.

(21) Appl. No.: 18/080,335

(22) Filed: Dec. 13, 2022

(65) Prior Publication Data

US 2024/0194729 A1 Jun. 13, 2024

(51) Int. Cl.

| | |
|---|---|
| ***H10D 1/47*** | (2025.01) |
| ***H10D 84/80*** | (2025.01) |
| ***H10D 88/00*** | (2025.01) |
| ***H10W 20/00*** | (2026.01) |
| ***H10W 20/20*** | (2026.01) |

(52) U.S. Cl.

CPC ............. *H10D 1/47* (2025.01); *H10D 84/811* (2025.01); *H10D 88/00* (2025.01); *H10W 20/023* (2026.01); *H10W 20/20* (2026.01)

(58) Field of Classification Search

CPC ........ H10D 1/47; H10D 84/811; H10D 88/00; H01L 21/76898; H01L 23/481; H10W 20/023

See application file for complete search history.

(56) References Cited

U.S. PATENT DOCUMENTS

| | | | | |
|---|---|---|---|---|
| 5,670,891 A * | 9/1997 | Ling | ....................... | H01L 22/34 324/716 |
| 6,483,168 B1 * | 11/2002 | Chiu | ......................... | H03F 1/22 257/539 |

(Continued)

FOREIGN PATENT DOCUMENTS

| | | | |
|---|---|---|---|
| CN | 104724662 A * | 6/2015 | |
| CN | 108083224 A * | 5/2018 | ......... B81C 1/00301 |

(Continued)

OTHER PUBLICATIONS

Lin, et al., “High-R Poly Resistance Deviation Improvement from Suppressions of Back-End Mechanical Stresses”, IEEE Transactions on Electron Devices, vol. 64, No. 10, Oct. 2017, pp. 4233-4241.

(Continued)

*Primary Examiner* — Laura M Menz
(74) *Attorney, Agent, or Firm* — Steinfl + Bruno LLP

(57) ABSTRACT

Compact polysilicon resistor structures, particularly for RF ICs, and methods of fabricating such structures. Embodiments include three-dimensional (3-D) IC structures that include a 3-D resistor configuration comprising disjointed polysilicon segments spaced by at least one IC substrate and connected by one or more conductive through-substrate vias (TSVs). Compared to the prior art, embodiments of the present invention provide a reduction in IC area required for a polysilicon resistor and result in the same performance while maintaining low parasitic capacitance. For example, by taking advantage of the substrate cross-sectional height, embodiments of the invention can achieve the same resistive performance while reducing area allocation by more than 30%.

14 Claims, 15 Drawing Sheets

(56) References Cited

U.S. PATENT DOCUMENTS 7,631,559 B2 * 12/2009 Mochida ................. G01P 15/18 73/514.36
8,421,073 B2 * 4/2013 Lin ..................... H01L 25/0657 257/E23.002
8,569,127 B2 * 10/2013 Chen ................... H01L 23/5228 438/210
9,130,004 B2 * 9/2015 Obu ..................... H10D 10/021
9,385,087 B2 * 7/2016 Chakraborty ....... H01L 23/5228
10,312,172 B2 * 6/2019 Otsubo ................. H01L 23/552
10,326,440 B1 * 6/2019 Malladi .................... H04B 1/48
10,629,523 B2 * 4/2020 Song ................... H01L 23/5228
11,456,293 B2 * 9/2022 Lin .......................... H10D 1/47
11,563,108 B2 * 1/2023 Yun .......................... H10D 1/47
11,588,008 B2 * 2/2023 Nandakumar ........... H10D 1/47
12,107,117 B2 * 10/2024 Nandakumar ..... H10D 84/0149
12,255,112 B2 * 3/2025 Yang ....................... H01L 22/30
2002/0033519 A1 * 3/2002 Babcock .............. H10D 84/209 257/E27.047
2005/0070102 A1 * 3/2005 Coolbaugh .......... H10D 84/817 257/E27.047
2006/0063317 A1 * 3/2006 Donze .................. H10D 86/201 438/176
2006/0163666 A1 7/2006 Shin et al.
2007/0096260 A1 * 5/2007 Eshun ................. H01L 23/5228 257/E27.047
2008/0169514 A1 * 7/2008 Hsueh ................. H01L 23/5228 257/379
2008/0237800 A1 * 10/2008 Chinthakindi .... H01L 21/76895 257/E29.001
2009/0140765 A1 * 6/2009 Chen .................... H10D 84/209 326/30
2009/0183571 A1 * 7/2009 Mochida ............. G01P 15/0802 73/514.36
2010/0328022 A1 * 12/2010 Fan .......................... H10D 1/47 257/E21.409
2012/0273782 A1 11/2012 Goel et al.
2013/0050885 A1 * 2/2013 Chen ........................ H02H 9/04 361/56
2013/0241001 A1 * 9/2013 Chen ................... H01L 23/5228 438/653
2013/0328131 A1 * 12/2013 Lu ........................... H10D 1/47 257/E27.011
2014/0167115 A1 * 6/2014 Obu ..................... H10D 10/021 257/197
2015/0108608 A1 * 4/2015 Chakraborty ............ H10D 1/47 257/538
2015/0221636 A1 * 8/2015 Chen .................... H10D 89/601 257/358
2015/0381121 A1 * 12/2015 Jones .................... H01L 23/047 257/532
2016/0056373 A1 * 2/2016 Goktepeli .............. H10B 63/22 257/2
2017/0125398 A1 * 5/2017 Nomura ................. H10D 89/60
2017/0162592 A1 * 6/2017 Nishikawa ............. H10B 43/40
2018/0092257 A1 * 3/2018 Otsubo .................. H05K 1/181
2018/0097001 A1 * 4/2018 Bi ........................ H10D 64/667
2018/0204781 A1 * 7/2018 Otsubo ................ H01L 23/552
2019/0273312 A1 * 9/2019 Otsubo .................... H05K 9/00
2019/0274237 A1 * 9/2019 Otsubo .................. H05K 3/284
2019/0371891 A1 * 12/2019 Goktepeli ......... H01L 21/30625
2020/0083158 A1 * 3/2020 Song .................. H01L 23/5223
2020/0105861 A1 * 4/2020 Ku ......................... H10D 86/85
2020/0227407 A1 * 7/2020 Radosavljevic ......... H10D 1/47
2020/0279905 A1 * 9/2020 Nandakumar ..... H10D 84/0149
2021/0057303 A1 * 2/2021 Chen ................... H01L 25/0657
2021/0057406 A1 * 2/2021 Lin ...................... H10D 84/811
2022/0271116 A1 * 8/2022 Adusumilli ............ H10D 87/00
2022/0359497 A1 * 11/2022 Lin .................... H10D 84/0135
2023/0141752 A1 * 5/2023 Nandakumar ....... H10D 84/811 257/213
2023/0290694 A1 * 9/2023 Yang ..................... H01L 23/481
2024/0088139 A1 * 3/2024 Lin ...................... H10D 84/013
2024/0194729 A1 * 6/2024 Moore .................. H01L 23/481
2024/0203892 A1 * 6/2024 Abesingha .............. H01L 24/24
2024/0282806 A1 * 8/2024 Luo ........................ H10D 1/474
2025/0015029 A1 * 1/2025 Goktepeli ............... H01L 24/80
2025/0150050 A1 * 5/2025 Mizuno .................... H01G 4/40
2025/0191981 A1 * 6/2025 Yang ..................... H01L 23/481
2025/0221013 A1 * 7/2025 Choppalli ............ H10D 84/209

FOREIGN PATENT DOCUMENTS

CN 108387341 A * 8/2018 ............. G01L 21/00
CN 109686725 A * 4/2019 ........... H01L 23/647
CN 112420693 A * 2/2021 ......... H10D 84/0135
CN 114664812 A * 6/2022 ............. H02H 9/046
CN 114975372 A * 8/2022 ........... H01L 23/647
CN 117404971 A * 1/2024 .............. F42C 11/00
DE 102022101533 A1 * 8/2022 ........... H01L 23/647
DE 102022101533 B4 * 9/2023 ........... H10D 86/201
DE 102022101533 B9 * 2/2024 ........... H10D 86/201
JP 2001005434 A * 1/2001
KR 10-2021-0122674 10/2021
TW I761911 B * 4/2022 ......... H10D 84/0135
WO WO-2015016806 A1 * 2/2015 .......... B41J 2/14072
WO WO-2017099792 A1 * 6/2017 ............. H10D 64/27
WO WO-2024129457 A1 * 6/2024 ............. H10D 88/00
WO WO-2024173142 A1 * 8/2024 ............... H03F 3/21

OTHER PUBLICATIONS

Allen, P.E., "Lecture 07—Resistors and Inductors", CMOS Analog Circuit Designed, Mar. 10, 2014, pp. 07-1-07/31.
R. Jacob Baker, CMOS Circuit Design, Layout, and Simulation, 4th Edition (IEEE Press Series on Microelectronic Systems) 2019, Chapter 4, pp. 83-104.
Lee, Kang Ha, International Search Report and Written Opinion received from the KIPO dated Apr. 4, 2024 for appln. No. PCT/US2023/082660, 10 pgs.

* cited by examiner

THREE-DIMENSIONAL INTEGRATED CIRCUIT RESISTORS

BACKGROUND

(1) Technical Field

The present invention relates to three-dimensional integrated circuit structures and circuits.

(2) Background

FIG. 1 is a cross-sectional diagram of a prior art silicon-on-insulator (SOI) integrated circuit (IC) 100 that includes a polysilicon resistor 101. In the illustrated example, a substrate 102 (e.g., sapphire, trap-rich silicon (Si), or high-resistivity Si) supports a substructure 104 comprising a buried oxide (BOX) insulator layer 106 which in turn supports an active layer 108. The substrate 102 is substantially thicker than the substructure 104, as indicated by the "break" across the illustrated example substrate 102. Note that it is not uncommon to use commercially available wafer substrates 102 having a pre-fabricated BOX insulator layer 106 and active layer 108, ready for formation of individual devices in or on the active layer 108.

In the illustrated example, metal-oxide-semiconductor field-effect transistors (MOSFETs) (an nFET and a pFET) are formed in and on the active layer 108. Each MOSFET includes a source S, drain D, and gate G. The polysilicon resistor 101, comprising an extent of polysilicon material, may be fabricated at the same time and with the same processes as a polysilicon gate G, or may be fabricated in a separate process step (e.g., for FETs using metal gates rather than polysilicon gates). A superstructure 110 is formed on the active layer 108, and generally comprises inter-layer dielectric (ILD) with one or more layers of conductive material (e.g., metallization layers M1, M2, M3, bonding sites, etc.), and vertical conductors (vias) 112. The polysilicon resistor 101 typically connects to the M1 metallization layer through at least two vias 112 in contact with the extent of polysilicon material.

A MOSFET IC die is essentially formed in two phases: a front-end-of-line (FEOL) phase in which the substructure 104 (including polysilicon gates G) is formed (or completed, if starting with a wafer substrate 102 having a pre-fabricated BOX insulator layer 106 and active layer 108), and a back-end-of-line (BEOL) phase in which the superstructure 110 is formed. The FEOL phase fabricates individual devices (e.g., transistors, resistors, diodes) in or on the active layer 108, while the BEOL phase fabricates some kinds of components (e.g., inductors and/or capacitors) as well as interconnections between the FEOL devices with conductors formed as part of or spanning one or more metallization layers. After FEOL and BEOL processing, a wafer undergoes a number of additional known process steps, including dicing, testing, and packaging, to form multiple ICs.

While the cross-sectional view of FIG. 1 shows the polysilicon resistor 101 as being just a linear expanse of polysilicon, a top-down view would show that a polysilicon resistor 101 may have a convoluted, typically meandering geometry in order to achieve a desired resistance value (greater path length equating to higher resistance). For example, FIG. 2 is a plan view of a prior art polysilicon resistor 101. A multi-segment path of polysilicon 202 extends between a pair of contacts 204*a*, 204*b* which each may include a via to the M1 metallization layer.

Referring again to FIG. 2, in radio frequency (RF) IC chips that include one or more polysilicon resistors 101, the polysilicon segments require a relatively large spacing d to minimize parasitic capacitance and preserve a resistance value. However, as operational frequencies increase, particularly in wireless communication and sensing applications (e.g., up to upper mmWave and sub-THz ranges), the segment spacing d consumes a larger IC area, which is not desirable. For example, at high frequencies (e.g., around 150 GHz), an antenna element of a phased array is already smaller than a typical RF IC, which presents challenges in packaging and interconnections.

Accordingly, there is a need for more compact polysilicon resistor structures, particularly for RF ICs. The present invention addresses this need.

SUMMARY

The present invention encompasses compact polysilicon resistor structures, particularly for RF ICs, and methods of fabricating such structures. Embodiments include three-dimensional (3-D) IC structures that include a 3-D resistor configuration comprising disjointed polysilicon segments spaced by at least one IC substrate and connected by one or more conductive through-substrate vias (TSVs). Compared to the prior art, embodiments of the present invention provide a reduction in IC area required for a polysilicon resistor and result in the same performance while maintaining low parasitic capacitance. For example, by taking advantage of the substrate cross-sectional height, embodiments of the invention can achieve the same resistive performance while reducing area allocation by more than 30%.

One embodiment of the present invention encompasses a three-dimensional integrated circuit resistor including disjointed polysilicon segments spaced by at least one integrated circuit substrate and electrically connected by one or more through-substrate vias.

The present invention also encompasses a method of making a three-dimensional IC structure including: fabricating a first substrate having a backside and a front-side and including a first substructure formed on the front-side of the first substrate, the first substructure including one or more polysilicon segments, and at least one through-substrate via each electrically coupled to one of the one or more front-side polysilicon segments of the first substructure and extending through and to the backside of the first substrate; fabricating a second substrate having a backside and a front-side and including a second substructure formed on the front-side of the second substrate, the second substructure including one or more polysilicon segments, and at least one through-substrate via, each electrically coupled to one of the one or more front-side polysilicon segments of the second substructure and extending through and to the backside of the second substrate; and bonding the backside of the first substrate to the backside of the second substrate such that the through-substrate vias through the first substrate align with and electrically couple to the through-substrate vias through the second substrate; wherein the polysilicon segments of the first substructure electrically coupled by the through-substrate vias to the polysilicon segments of the second substructure function as an electrical resistor.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses compact polysilicon resistor structures, particularly for RF ICs, and methods of fabricating such structures. Embodiments includes three-dimensional (3-D) IC structures that include a 3-D resistor configuration comprising disjointed polysilicon segments spaced by an IC substrate and connected by conductive through-substrate vias (TSVs). Compared to the prior art, embodiments of the present invention provide a reduction in IC area required for a polysilicon resistor and result in the same performance while maintaining low parasitic capacitance. For example, by taking advantage of the substrate cross-sectional height, embodiments of the invention can achieve the same resistive performance while reducing area allocation by more than 30%.

First Embodiment—Bonded Substrates

Figure 3A:
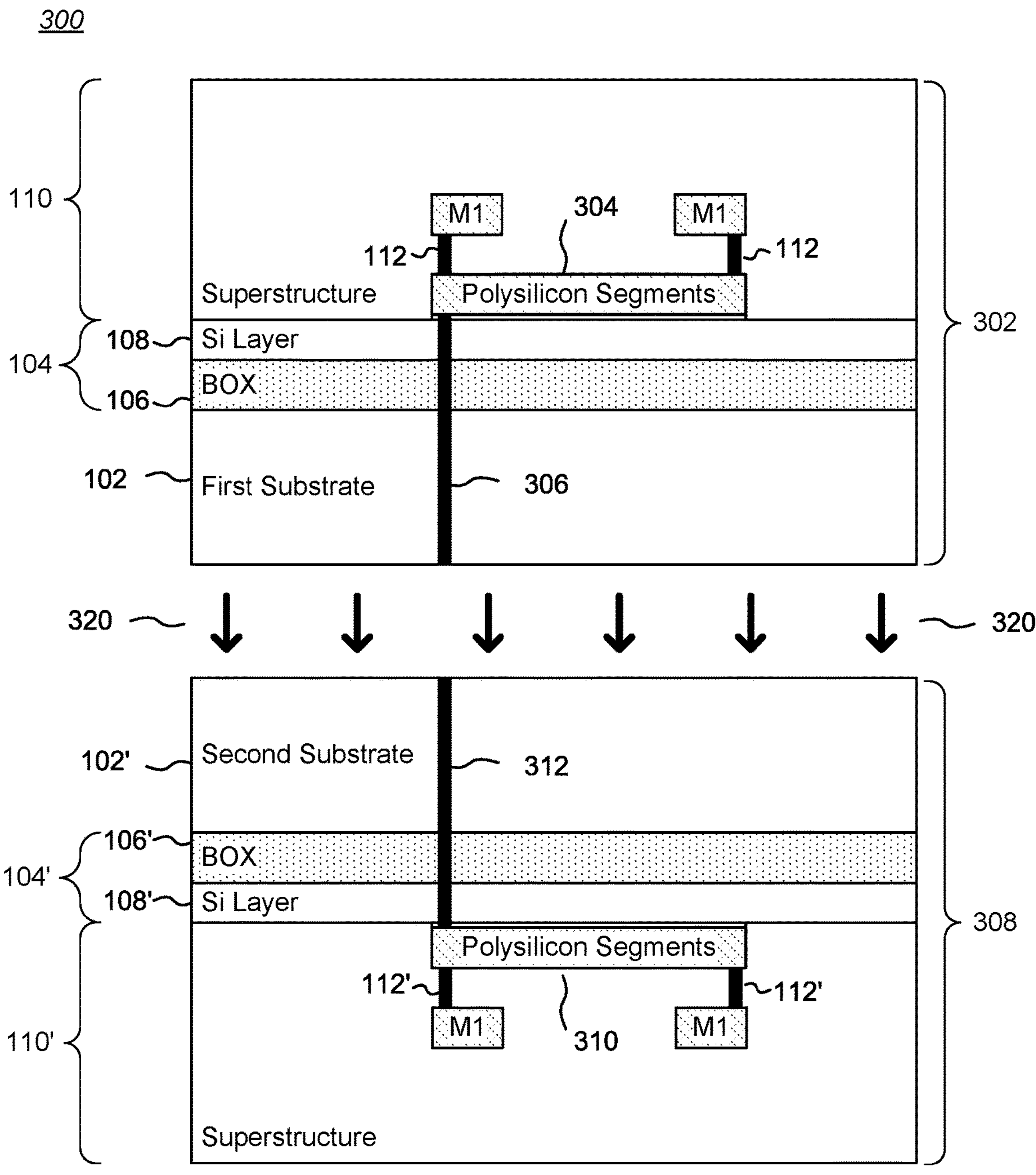
FIG. 3A is a cross-sectional diagram of a first SOI IC structure that includes a 3-D polysilicon resistor, shown before bonding.
Figure 3B:
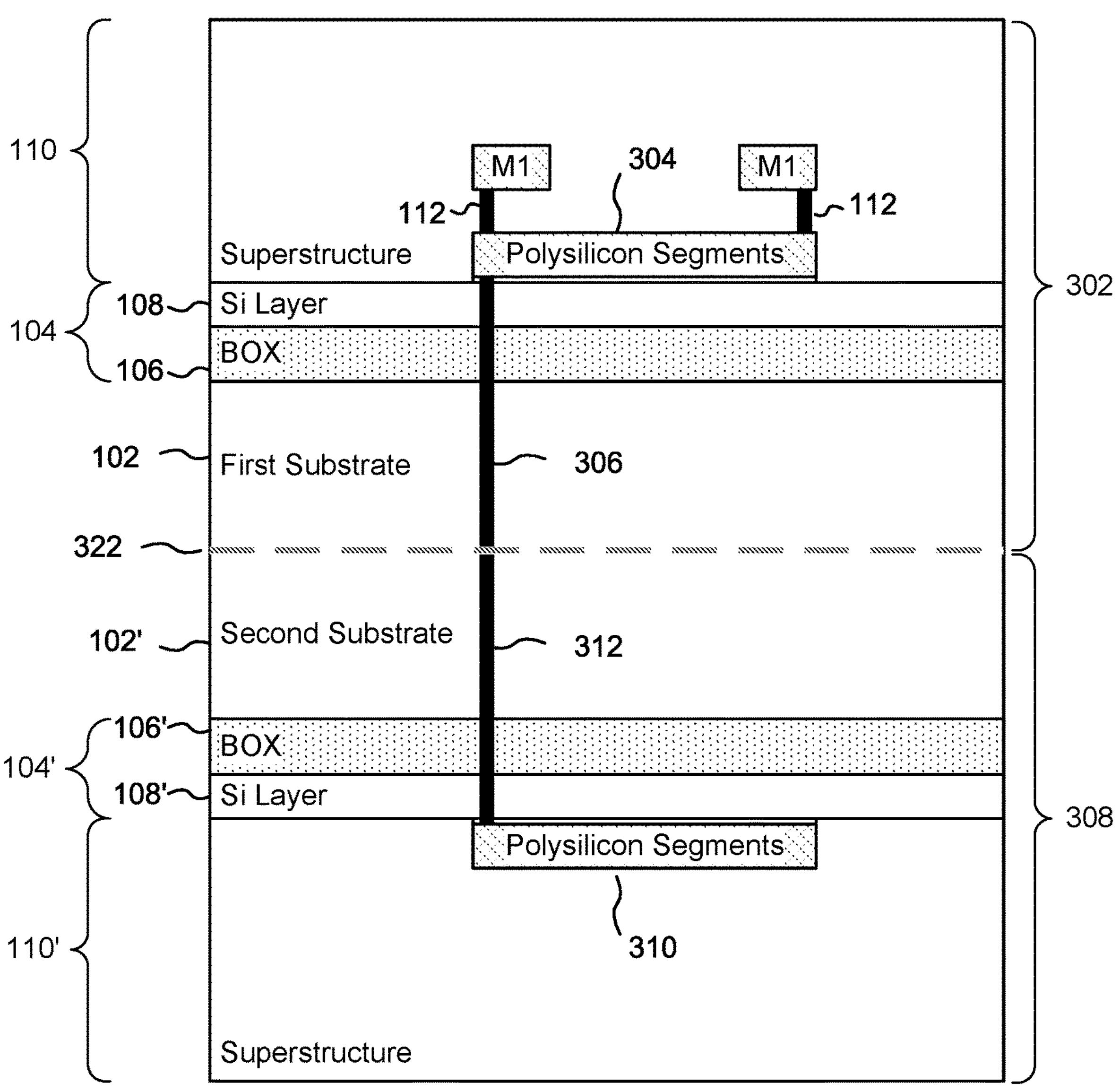
FIG. 3B is a cross-sectional diagram of the structure of FIG. 3A after bonding, thus forming a 3-D IC.

FIG. 3A is a cross-sectional diagram of a first SOI IC structure 300 that includes a 3-D polysilicon resistor, shown before bonding. FIG. 3B is a cross-sectional diagram of the structure 300 of FIG. 3A after bonding, thus forming a 3-D IC.

In the illustrated example, a first IC structure 302 comprising a first substrate 102 supports a corresponding substructure 104 including a BOX insulator layer 106, which in turn supports an active layer 108. The substructure 104 is thus formed on the front-side of the first substrate 102. Polysilicon resistor segments 304 are generally fabricated at the same time and with the same processes as the gates of FET devices (not shown). A superstructure 110 is formed on the active layer 108, and generally comprises inter-layer dielectric (ILD) with formed layers of conductive material (only the M1 layer is shown to avoid clutter) and vertical conductors (vias) 112. At least one of the polysilicon resistor segments 304 typically connects to the M1 metallization layer through one or more vias 112 (two vias 112 are shown by way of example only). At least one conductive TSV 306 is formed in known fashion from the backside of the first substrate 102 (i.e., opposite the BOX layer 106) to a corresponding polysilicon resistor segment 304.

A second IC structure 308 comprising a second substrate 102' supports a corresponding substructure 104' including a BOX insulator layer 106' which in turn supports an active layer 108'. The substructure 104' is thus formed on the front-side of the second substrate 102'. In some embodiments, the second substrate 102' may be different from the first substrate 102 (e.g., bulk silicon versus sapphire). Polysilicon resistor segments 310 are generally fabricated at the same time and with the same processes as the gates of FET devices (not shown). A superstructure 110' is formed on the active layer 108'. At least one conductive TSV 312 is formed from the backside of the second substrate 102' (i.e., opposite the BOX layer 106') to a corresponding polysilicon resistor segment 310. In the illustrated example, the second IC structure 308 is essentially a "flipped" instance of the first IC structure 302. However, the circuitry within the IC structures 302, 308 need not be identical.

In some embodiments, at least one of the polysilicon resistor segments 310 may connect to an M1 metallization layer within the superstructure 110' of the second substrate 102' through one or more vias 112'.

It should be appreciated that FIGS. 3A and 3B show only a portion of two wafers processed to each include a substructure 102, 102' and a superstructure 110, 110'. A wafer generally will include multiple instances of pre-singulated dies that, in general, will be diced into individual essentially identical IC chips.

Figure 3C:
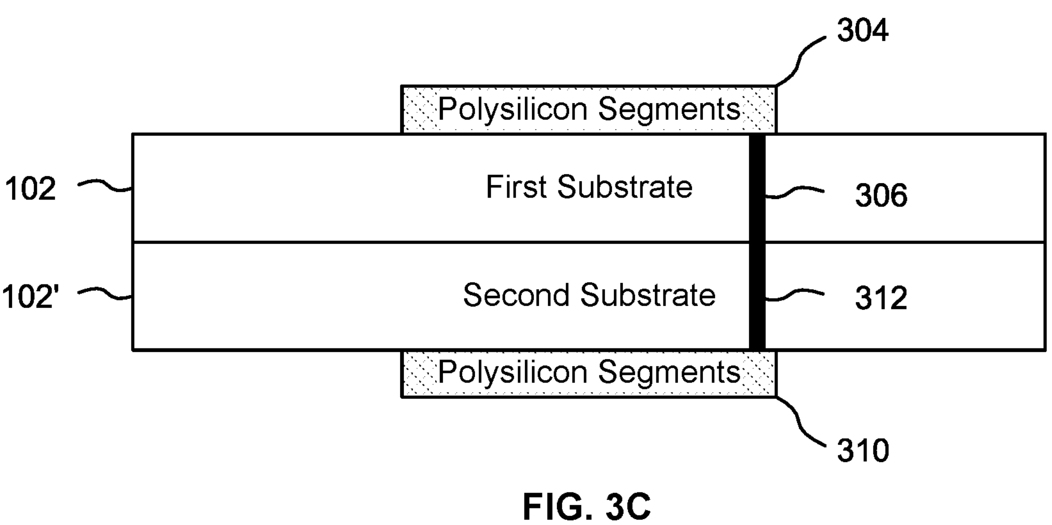
FIG. 3C is a simplified cross-sectional diagram of the 3-D IC structure of FIG. 3B.

In the illustrated example, the arrows 320 in FIG. 3A indicate that the first substrate 102 and the second substrate 102' of the separate first IC structure 302 and second IC structure 308, respectively, are to be bonded together. FIG. 3B depicts the combined 3-D IC structure resulting from bonding the first IC structure 302 with the second IC structure 308, with dashed line 322 indicating the bonding interface between the first substrate 102 and the second substrate 102'. FIG. 3C is a simplified cross-sectional diagram of the 3-D IC structure of FIG. 3B. In some embodiments, either of both of the first substrate 102 and/or the second substrate 102' may be thinned (e.g., by mechanical grinding or chemical mechanical polishing (CMP)) before bonding.

The bonding process used to create the combined structure shown in FIG. 3B may be by wafer-to-wafer bonding, die-to-wafer bonding, or die-to-die bonding, as desired. Bonding may be accomplished by any desired and suitable process, including (without limitation) bonding methods that enable attachment of two or more substrates to one another through a range of physical and/or chemical processes. Known bonding techniques include: adhesive; anodic; eutectic; fusion; glass frit; metal diffusion; hybrid; and solid liquid inter-diffusion (SLID). The only limitation on the bonding method selected is that electrical contact must exist between corresponding aligned TSVs 306, 312 after bonding is completed so that the polysilicon resistor segments 304, 310 are electrically coupled.

Second Embodiment—Bonding of Superstructures

Figure 4A:
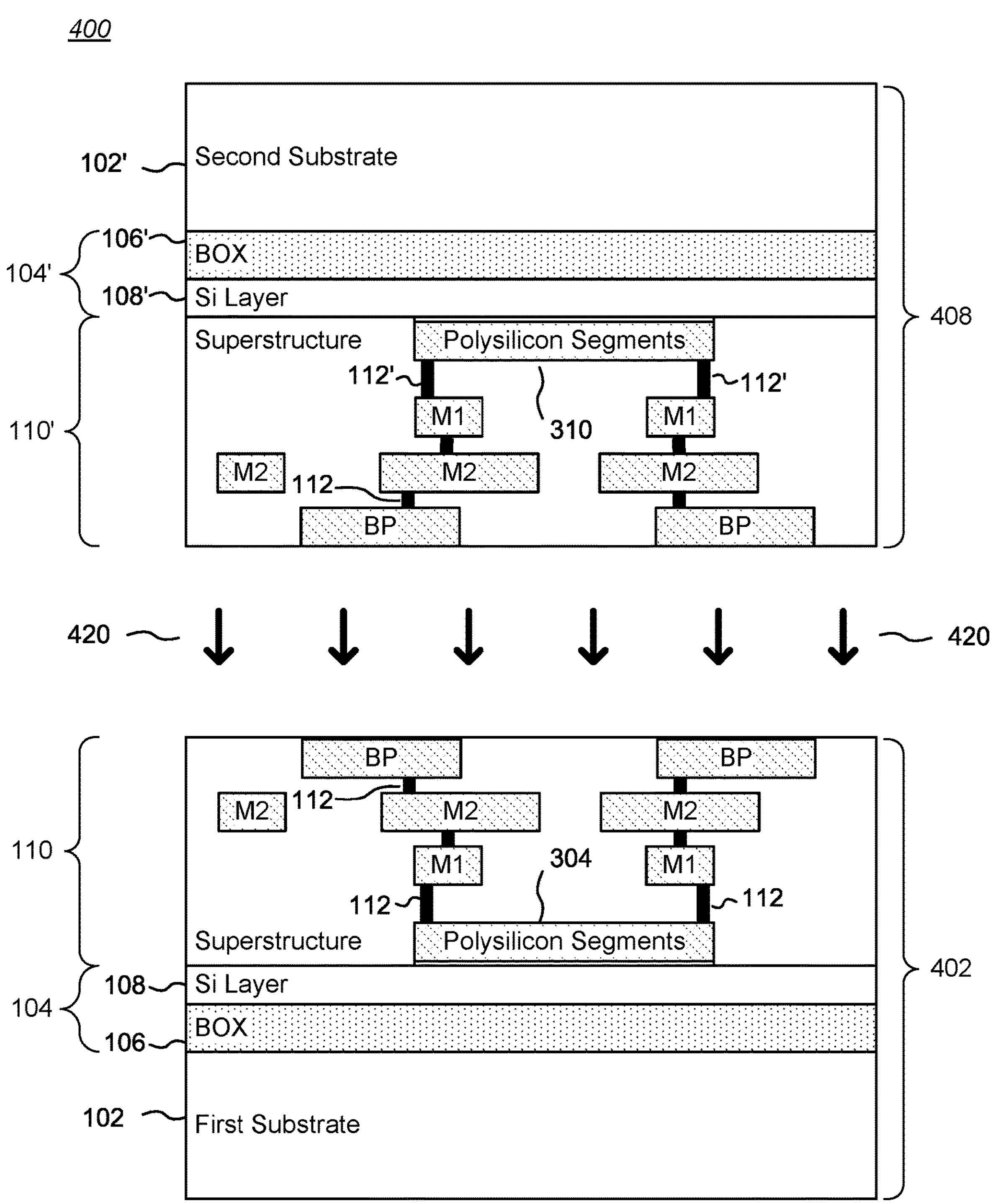
FIG. 4A is a cross-sectional diagram of a second SOI IC structure that includes a 3-D polysilicon resistor, shown before bonding.
Figure 4B:
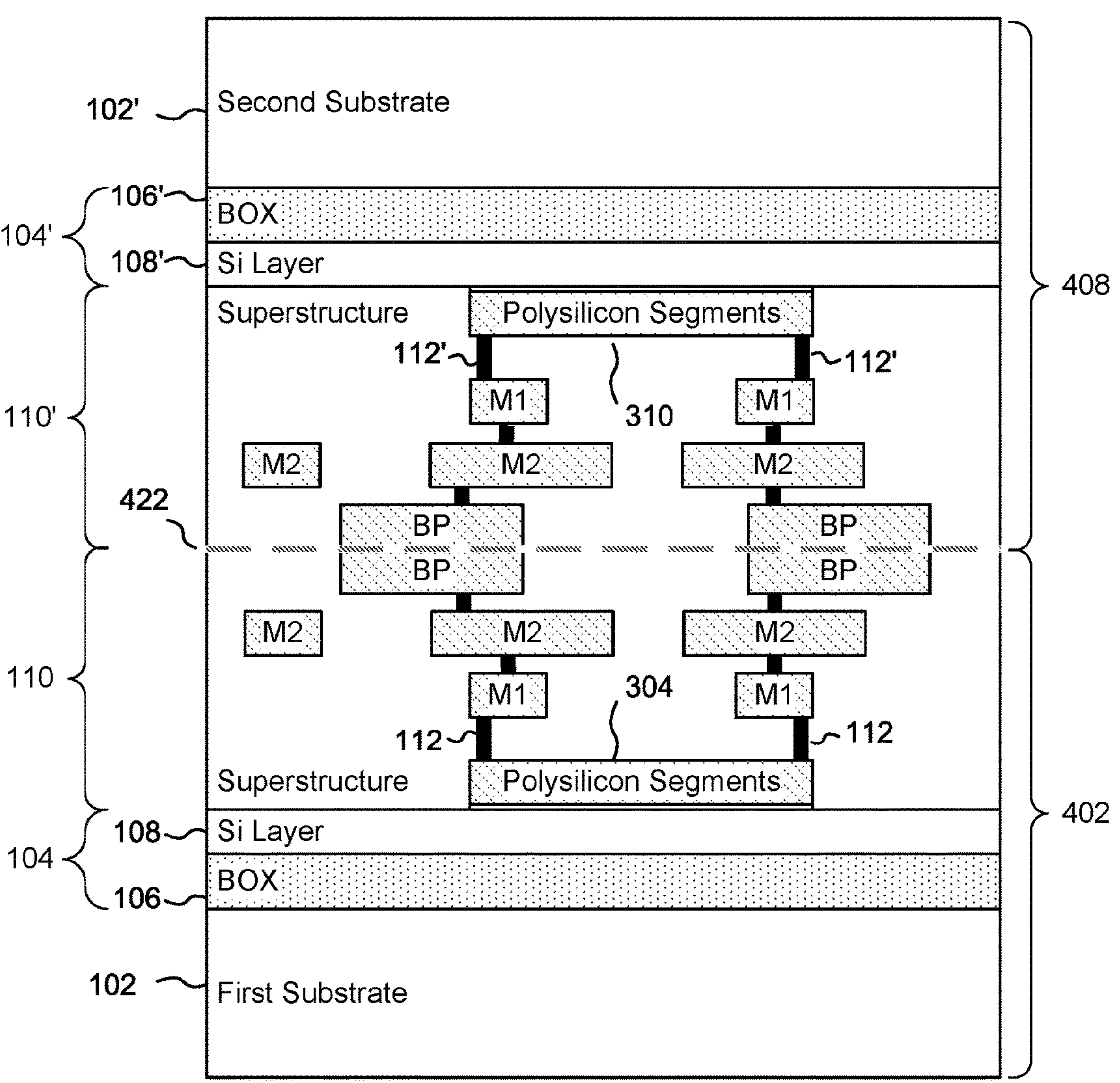
FIG. 4B is a cross-sectional diagram of the structure of FIG. 4A after bonding, thus forming a 3-D IC.

FIGS. 3A and 3B show a 3-D polysilicon resistor made using bonded substrates and conductive TSVs 306, 312. An alternative 3-D IC having one or more 3-D polysilicon resistors may also be made by bonding mated superstructures 110. For example, FIG. 4A is a cross-sectional diagram of a second SOI IC structure 400 that includes a 3-D polysilicon resistor, shown before bonding. FIG. 4B is a cross-sectional diagram of the structure of FIG. 4A after bonding, thus forming a 3-D IC. A first IC structure 402 comprising a first substrate 102 supports a corresponding substructure 104 including a BOX insulator layer 106, which in turn supports an active layer 108. Polysilicon resistor segments 304 are generally fabricated at the same time and with the same processes as the gates of FET devices (not shown). A superstructure 110 is formed on the active layer 108, and generally comprises inter-layer dielectric (ILD) with formed layers of conductive material and vertical conductors (vias) 112. At least one of the polysilicon resistor segments 304 typically connects to the M1 metallization layer through one or more vias 112 (two vias 112 to M1 are shown by way of example only). Additional vias 112 and metallization layers (M2 is shown) connect the polysilicon resistor segments 304 to at least one bonding pad BP on the exposed top surface of the superstructure 110.

A second IC structure 408 comprising a second substrate 102' supports a corresponding substructure 104' including a BOX insulator layer 106' which in turn supports an active layer 108'. In some embodiments, the second substrate 102' may be different from the first substrate 102 (e.g., bulk silicon versus sapphire). Polysilicon resistor segments 310 are generally fabricated at the same time and with the same processes as the gates of FET devices (not shown). A superstructure 110' is formed on the active layer 108'. At least one of the polysilicon resistor segments 310 typically connects to the M1 metallization layer through one or more vias 112' (two vias 112' to M1 are shown by way of example only). Additional vias 112' and metallization layers (M2 is shown) connect the polysilicon resistor segments 310 to at least one bonding pad BP on the exposed top surface of the superstructure 110'. In the illustrated example, the second IC structure 408 is essentially a "flipped" instance of the first IC structure 402. However, the circuitry within the IC structures 402, 408 need not be identical.

In the illustrated example, the arrows 420 in FIG. 4A indicate that the respective superstructures 110, 110' of the separate first IC structure 402 and second IC structure 408 are to be bonded together. FIG. 4B depicts the combined 3-D IC structure resulting from bonding the first IC structure 402 with the second IC structure 408, with dashed line 422 indicating the bonding interface between the superstructures 110, 110'.

The bonding process used to create the combined structure shown in FIG. 4B may be by wafer-to-wafer bonding, die-to-wafer bonding, or die-to-die bonding, as desired. Bonding may be accomplished by any desired and suitable process, including (without limitation) bonding methods that enable attachment of two or more substrates to one another through a range of physical and/or chemical processes. Known bonding techniques include: adhesive; anodic; eutectic; fusion; glass frit; metal diffusion; hybrid; and solid liquid inter-diffusion (SLID). The only limitation on the bonding method selected is that electrical contact must exist between corresponding aligned bonding pads BP after bonding is completed so that the polysilicon resistor segments 304, 310 are electrically coupled.

It should be appreciated that FIGS. 4A and 4B show only a portion of two wafers processed to each include a substructure 104, 104' and a superstructure 110, 110'. A wafer generally will include multiple instances of pre-singulated dies that, in general, will be diced into individual essentially identical IC chips.

Third Embodiment—Double-Sided Substrate

Figure 5A:
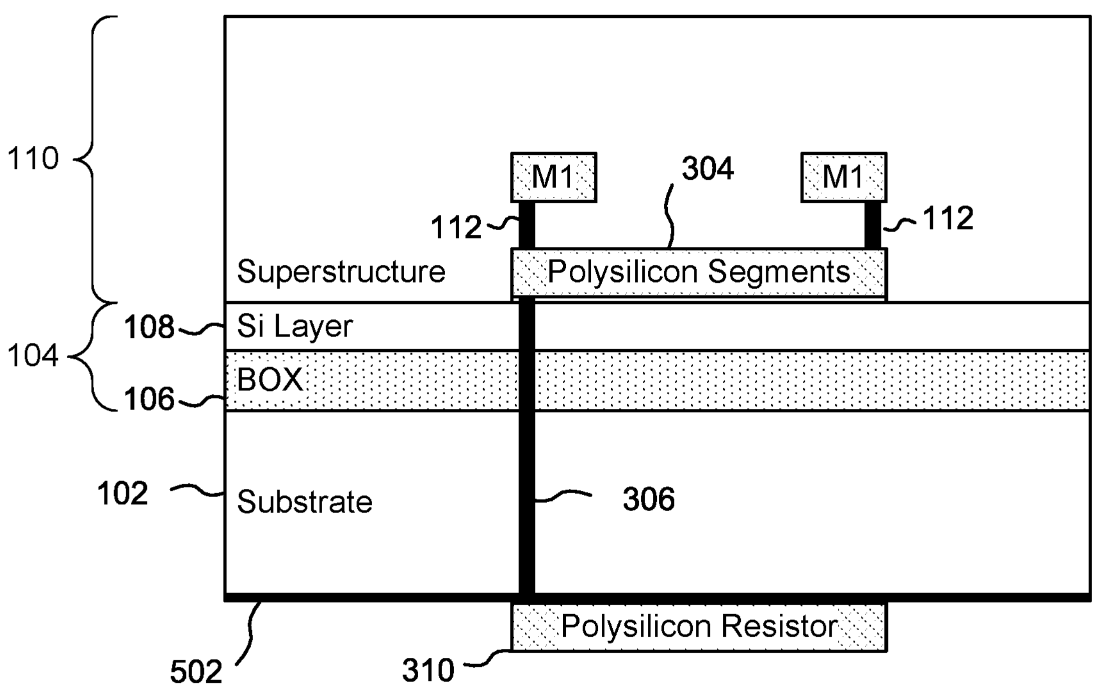
FIG. 5A is a cross-sectional diagram of a third SOI IC structure that includes a 3-D polysilicon resistor.

FIG. 5A is a cross-sectional diagram of a third SOI IC structure 500 that includes a 3-D polysilicon resistor. In the illustrated example, the IC structure 500 comprises a substrate 102 that supports a corresponding substructure 104 including a BOX insulator layer 106, which in turn supports an active layer 108. Polysilicon resistor segments 304 are generally fabricated at the same time and with the same processes as the gates of FET devices (not shown). A corresponding superstructure 110 is formed on the active layer 108, and generally comprises inter-layer dielectric (ILD) with formed layers of conductive material (only the M1 layer is shown to avoid clutter) and vertical conductors (vias) 112. At least one of the polysilicon resistor segments 304 typically connects to the M1 metallization layer through one or more vias 112 (two vias 112 are shown by way of example only). At least one conductive TSV 306 is formed in known fashion from the backside of the substrate 102 (i.e., opposite the BOX layer 106) to a corresponding polysilicon resistor segment 304.

In the illustrated embodiment, rather than bond a "flipped" IC structure to the backside of the substrate 102 (i.e., opposite the BOX layer 106), the backside of the substrate 102 is further processed (e.g., as part of a BEOL process). In some embodiments, the substrate 102 may be thinned before such further processing. One additional process step may be to form an electrically insulating layer 502 (e.g., $SiO_2$) on the backside of the substrate 102. For some suitably non-conductive substrates (e.g., glass or sapphire), the electrically insulating layer 502 may not be needed. Another additional process step is to form polysilicon resistor segments 310 (e.g., by conventional deposition, masking, and etching steps) that are each in electrical contact with at least one conductive TSV 306. Accordingly, the added polysilicon resistor segments 310 will be electrically connected to corresponding polysilicon resistor segments 304.

Figure 5B:
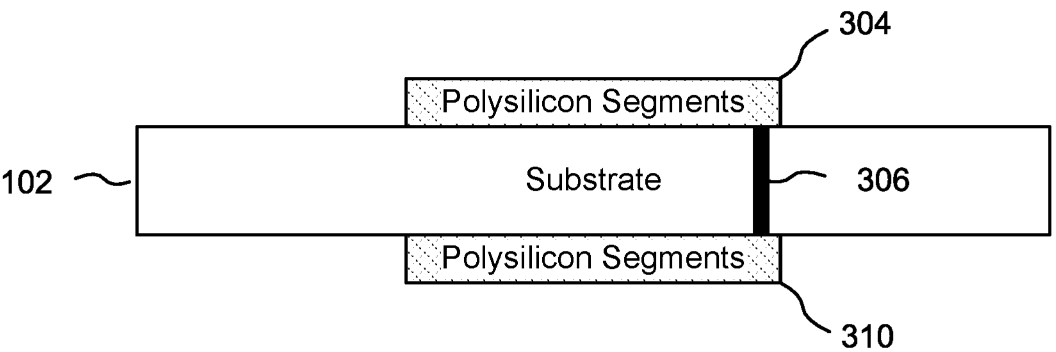
FIG. 5B is a simplified plan view of the combined post-processing polysilicon resistor segments on a double-sided substrate.

FIG. 5B is a simplified plan view of the combined post-processing polysilicon resistor segments on a double-sided substrate.

In an alternative embodiment, the conductive TSVs 306 may be formed after the formation of the "backside" polysilicon resistor segments 310.

Resistor Segment Geometries

Figure 6A:
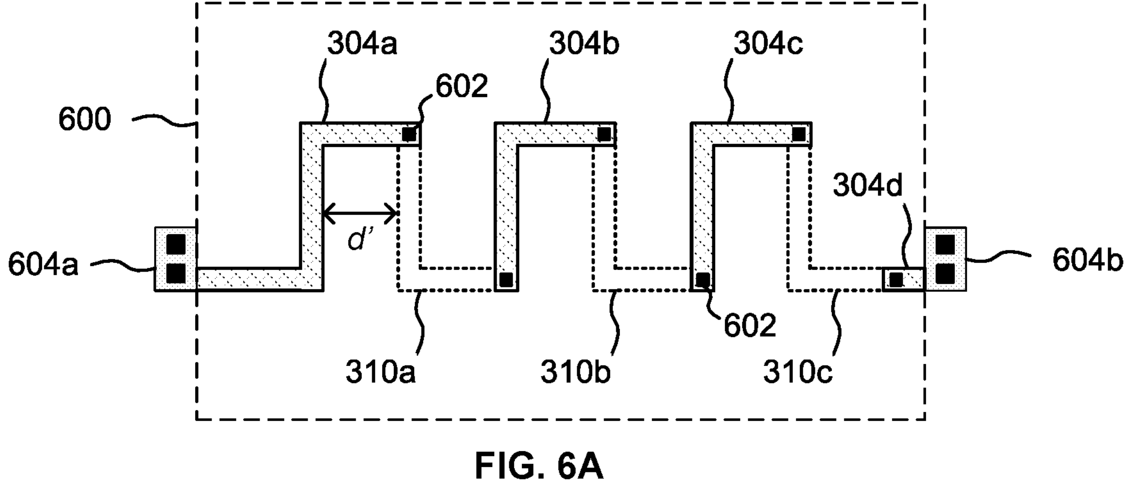
FIG. 6A is a simplified plan view of a polysilicon resistor comprising a first configuration of polysilicon resistor segments.

Any of the IC structures 300, 400, 500 described above may be configured with a variety of geometries for the vertically-separated resistor segments 304, 310. For example, FIG. 6A is a simplified plan view of a polysilicon resistor 600 comprising a first configuration of polysilicon resistor segments 304, 310. Polysilicon resistor segments 304*a*-304*d* (collectively, 304) are located in a first IC structure (e.g., 302, 402). Polysilicon resistor segments 310*a*-310*c* (collectively, 310) are located in a second IC structure (e.g., 308, 408). Dotted outlines of the polysilicon resistor segments 310*a*-310*c* indicate a different level in the combined bonded 3-D IC structure; the dotted outlines thus represent a phantom view.

Associated ends of the polysilicon resistor segments 304, 310 are electrically coupled by corresponding "vertical" electrical connectors 602 (e.g., conductive TSVs or a combination of bonding pads BP, metallization layers, and vias). The width of each polysilicon resistor segment 304, 310 may be selected to conduct a specified current density. The resistivity of the polysilicon resistor segments 304, 310 may be controlled in part by the level of doping of a selected dopant. The length of each polysilicon resistor segment 304, 310 contributes to the overall resistance of the polysilicon resistor 600.

Note that the vertical electrical connectors 602, although conductive, still add to the total resistance of the polysilicon resistor 600. Selection of the conductive material for the vertical electrical connectors 602 may thus assist in setting a final resistance value. For example, vertical electrical connectors 602 made of copper (resistivity of $1.7\times10^{-8}$ ohm-meters) will exhibit less resistance than vertical electrical connectors 602 made of tungsten (resistivity of $4.9\times10^{-8}$ ohmmeters). In the case of TSVs, since the length of the TSVs is a factor in setting the final resistance value of the polysilicon resistor 600, then the combined thickness of the first and second substrates 102, 102' will be a factor as well. Accordingly, thinning either of both of the first substrate 102 and/or the second substrate 102' may be employed as one control of the total resistance of the polysilicon resistor 600.

In the example shown in FIG. 6A, most of the polysilicon resistor segments 304, 310 are "L" shaped, and electrical connections 604*a*, 604*b* to the combined sets of polysilicon resistor segments 304, 310 are made to the end-segments 304*a*, 304*d* of the polysilicon resistor segments 304 within a first IC structure (e.g., through vias to the M1 layer). However, in alternative embodiments, a first electrical connection 604*a* may be made to end-segment 304*a* within a first IC structure (e.g., 302, 402), and a second electrical connection 604*b* may be made to segment 310*c* within a second IC structure (e.g., 308, 408), in which case segment 304*d* may not be needed. Accordingly, the polysilicon resistor 600 may resist the flow of current between circuits and/or devices located in the first and second IC structures.

Figure 1:
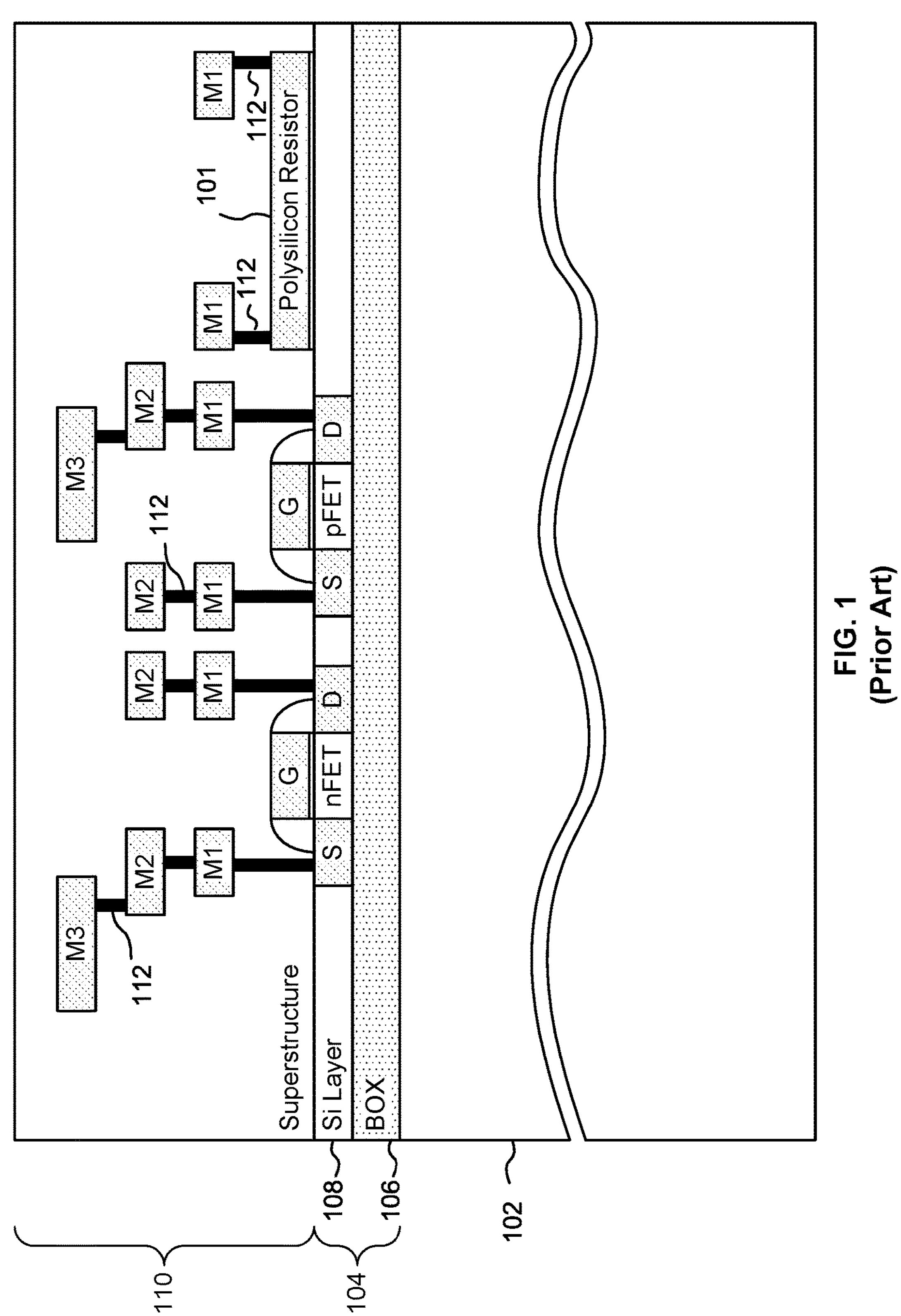
FIG. 1 is a cross-sectional diagram of a prior art silicon-on-insulator (SOI) integrated circuit (IC) that includes a polysilicon resistor.
Figure 2:
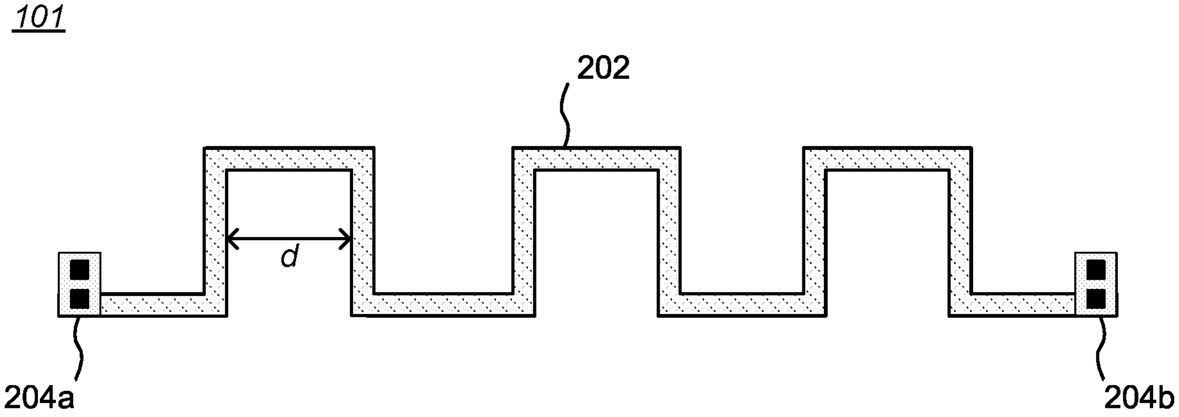
FIG. 2 is a plan view of a prior art polysilicon resistor.

Notably, by alternating connections to "vertically" (for example, with respect to FIG. 3A) separated segments of the polysilicon resistor 600, the segment spacing d' of the spaced-apart polysilicon resistor segments may be reduced such that d' is less than the d dimension of a conventional design like the example of FIG. 1. In some cases, the reduction in segment spacing provides a two-dimensional IC area reduction of more than about 30% for the polysilicon resistor 600. Accordingly, embodiments of the invention can achieve the same resistive performance as prior art polysilicon resistors while reducing die area allocation or "IC footprint".

Figure 6B:
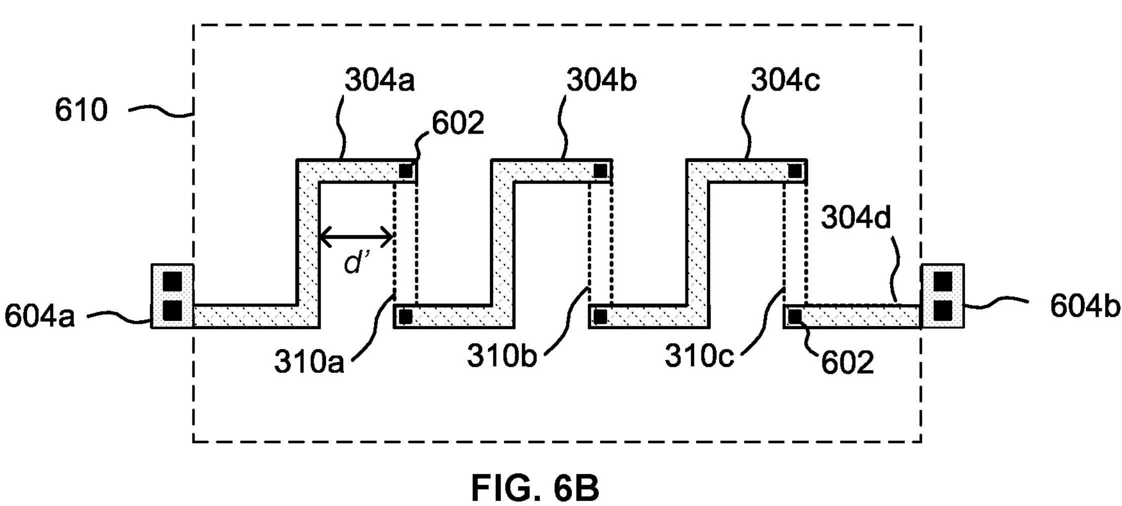
FIG. 6B is a simplified plan view of a polysilicon resistor comprising a second configuration of polysilicon resistor segments.

It should be clear that numerous other configurations of polysilicon resistor segments 304, 310 may be devised without departing from the teachings of the present invention. For example, FIG. 6B is a simplified plan view of a polysilicon resistor 610 comprising a second configuration of polysilicon resistor segments 304, 310. Polysilicon resistor segments 304*a*-304*d* (collectively, 304) are located in a first IC structure. Polysilicon resistor segments 310*a*-310*c* (collectively, 310) are located in a second IC structure. Again, dotted outlines of the polysilicon resistor segments 310*a*-310*c* indicate a different level in the combined bonded 3-D IC structure. Associated ends of the polysilicon resistor segments 304. 310 are electrically connected by corresponding vertical electrical connectors 602. In the illustrated example, electrical connections 604*a*, 604*b* to the combined sets of polysilicon resistor segments 304, 310 are made to the polysilicon resistor end-segments 304*a*, 304*d* within the first IC structure.

In the example shown in FIG. 6B, most of the polysilicon resistor segments 304 are "Z" shaped, while the polysilicon resistor segments 310 are "I" shaped straight bars. The overall geometry and IC footprint of the polysilicon resistor 610 essentially matches the geometry and IC footprint of the polysilicon resistor 600 if the length of the combined polysilicon resistor segments 304, 310 is the same for the two configurations, and thus the total resistance of the polysilicon resistor 400 would match the total resistance of the polysilicon resistor 600.

Figure 6C:
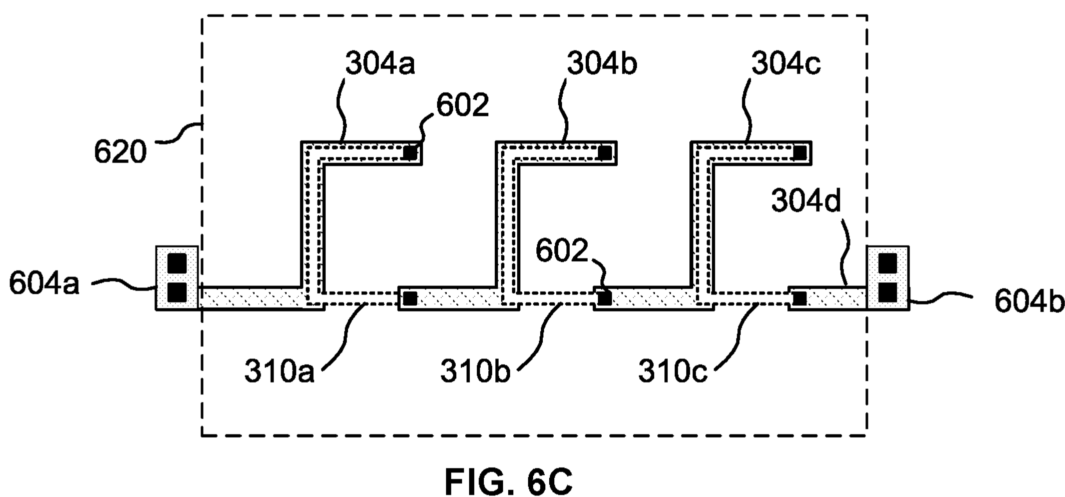
FIG. 6C is a simplified plan view of a polysilicon resistor comprising a third configuration of polysilicon resistor segments.
Figure 6D:
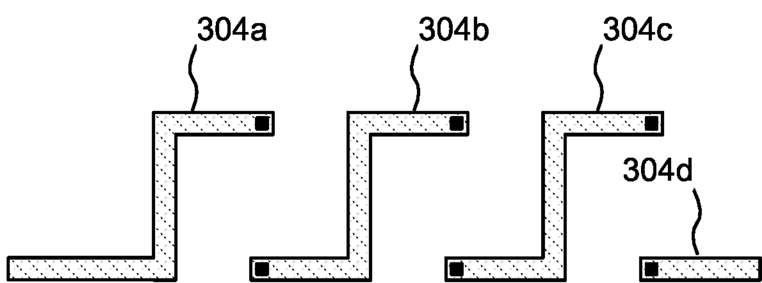
FIG. 6D is a simplified plan view of just the polysilicon resistor segments of a first layer of FIG. 6C.
Figure 6E:
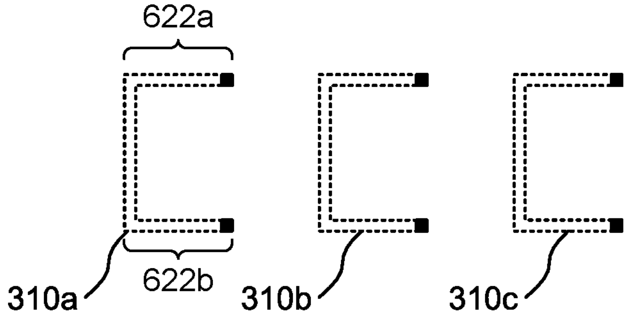
FIG. 6E is a simplified plan view of just the polysilicon resistor segments of a second layer of FIG. 6C.

As another example, FIG. 6C is a simplified plan view of a polysilicon resistor 620 comprising a third configuration of polysilicon resistor segments 304, 310. FIG. 6D is a simplified plan view of just the polysilicon resistor segments 304*a*-304*d* (collectively, 304) on a first layer of FIG. 6C. FIG. 6E is a simplified plan view of just the polysilicon resistor segments 310*a*-310*c* (collectively, 310) of a second layer of FIG. 6C. Polysilicon resistor segments 304 are located in a first IC structure, and polysilicon resistor segments 310 are located in the second IC structure. As above, dotted outlines of the polysilicon resistor segments 310*a*-310*c* indicate a different level in the combined bonded IC structure. As in the examples of FIGS. 6A and 6B, corresponding ends of the polysilicon resistor segments 304, 310 are electrically connected by corresponding vertical electrical connectors 602. In the illustrated example, electrical connections 604*a*, 604*b* to the combined sets of polysilicon resistor segments 304, 310 are made to the end-segments 304*a*, 304*d* of the polysilicon resistor segments 304 within the first IC structure.

In the example shown in FIGS. 6C-6E, most of the polysilicon resistor segments 304 are "Z" shaped, while the polysilicon resistor segments 310 are "C" shaped. (Note that the polysilicon resistor segments 310 are shown to be narrower compared to the polysilicon resistor segments 304, but that is only so the overlapped configuration in FIG. 6C is visible.) The "C" shape of the polysilicon resistor segments 310 results in a partially underlapping relationship with respect to the Z-shaped polysilicon resistor segments 304 that adds two extra horizontal subsegments 622*a*, 622*b* to each polysilicon resistor segment 310*a*-310*c* compared to the configurations of FIGS. 6A and 6B.

An advantage of the geometry of the polysilicon resistor 620 is that (1) the IC footprint may be reduced for the same total resistance of the polysilicon resistor 620 compared to the IC footprint of the polysilicon resistors 600, 610 of FIGS. 6A and 6B, respectively, or (2) in the same IC footprint as the polysilicon resistors 600, 610 of FIGS. 6A and 6B, respectively, the total resistance of the polysilicon resistor 620 may be increased due to all of the added subsegments 622*a*, 622*b* (assuming that the polysilicon segments are of the same widths and doping levels).

In alternative embodiments, the lengths of the subsegments 622*a*, 622*b* may be increased so that there is little or no overlap of the vertical subsegments of the polysilicon resistor segments 304, 310, thus increasing the resistance of the polysilicon resistor 620 without expanding the IC footprint compared to the full-overlap configuration shown in FIG. 6C.

Figure 6F:
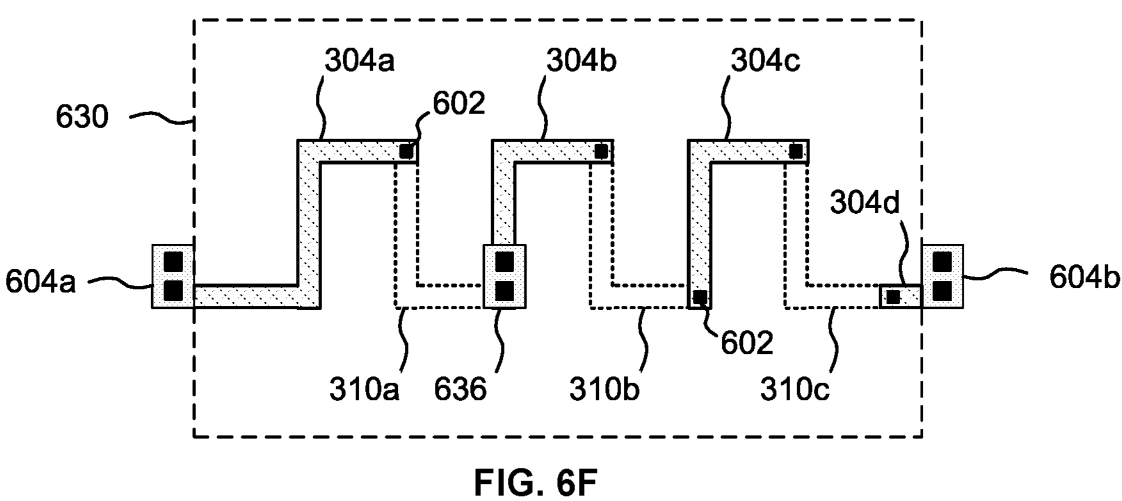
FIG. 6F is a simplified plan view of a polysilicon resistor comprising a fourth configuration of polysilicon resistor segments.

As another example, FIG. 6F is a simplified plan view of a polysilicon resistor 630 comprising a fourth configuration of polysilicon resistor segments. Similar in most aspects to the configuration of FIG. 6A, the illustrated embodiment further includes a middle electrical connection 636 or "tap". The extra connection 636 allows the polysilicon resistor 630 to behave as two resistors connected in series, which may be useful, for example, as a resistive divider. Other embodiments may have more than one additional "tap" connection.

Figure 6G:
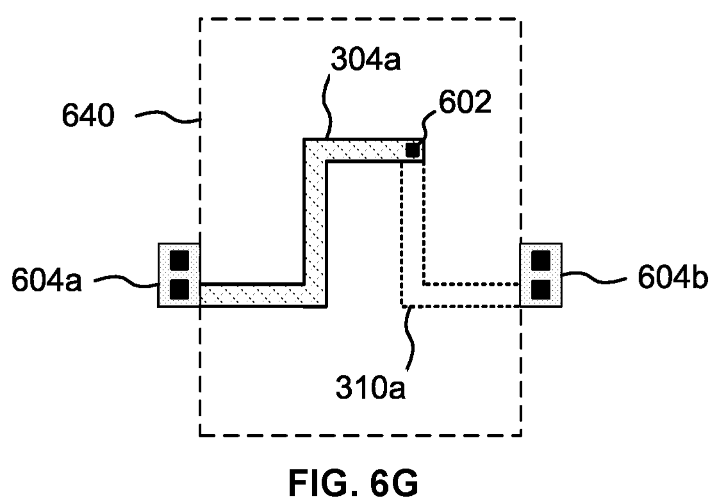
FIG. 6G is a simplified plan view of a polysilicon resistor comprising a minimal number of polysilicon resistor segments.

As yet another example, a polysilicon resistor may comprise only one polysilicon resistor segment within each of first and second IC structures (e.g., 302 and 308). FIG. 6G is a simplified plan view of a polysilicon resistor 640 comprising a minimal number of 3-D polysilicon resistor segments. More particularly, there is only one polysilicon resistor segment 304*a* within a first IC structure and only one polysilicon resistor segment 310*a* within a second IC structure, with electrical connections 604*a* and 604*b* connected to respective polysilicon resistor segments (the shapes of the polysilicon resistor segments 304*a*, 310*a* may vary from the example shown). In one version of such a minimal configuration, each of the electrical connections 604*a* and 604*b* is located in a different IC structure (e.g., 302 and 308 in FIG. 3A). In another version of such a minimal configuration, both of the electrical connections 604*a* and 604*b* are located in the same IC structure (e.g., one of IC structure 302 or IC structure 308). In this latter case, vertical electrical connectors would be needed from the "bottom" polysilicon resistor segment 310*a* to the corresponding electrical connection 604*b*.

Figure 7:
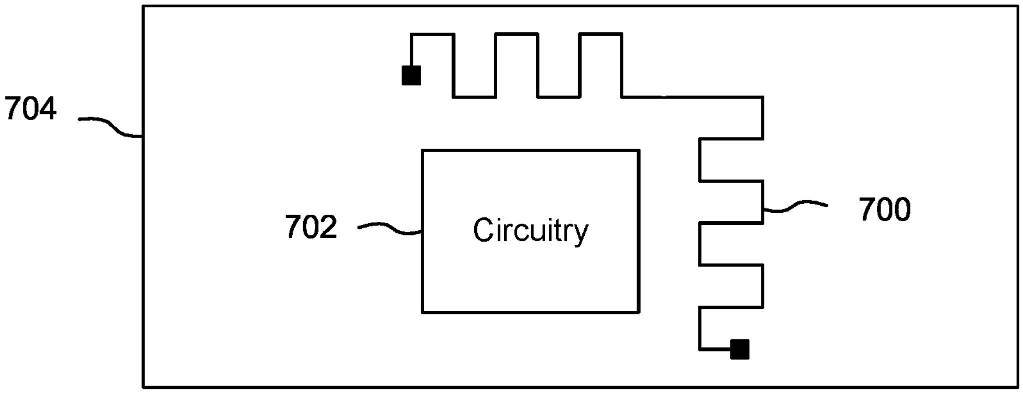
FIG. 7 is a simplified schematic diagram of a polysilicon resistor made in accordance with the teachings of this disclosure, laid out so as to "bend" around a block of circuitry within an IC.

As the examples of FIGS. 6A-6G suggest, there are numerous other configurations of polysilicon resistor segments 304, 310 that may be devised without departing from the teachings of the present invention. For example, while the polysilicon resistors of FIGS. 6A-6G are depicted in a generally left-to-right orientation with respect to the drawing page, the polysilicon resistor segments may be laid out so as to be in a generally top-to-bottom orientation with respect to the drawing page. As another example, FIG. 7 is a simplified plan view of a polysilicon resistor 700 made in accordance with the teachings of this disclosure, laid out so as to "bend" around a block of circuitry 702 within an IC 704. More generally, additional permutations of polysilicon resistor segment layouts may be used to optimize different applications for reduced parasitic capacitance.

Circuit Embodiments

While the examples of the invention described above are based on SOI ICs, it should be appreciated that that any IC technology or process the allows fabrications of polysilicon resistors and TSVs may utilize the present invention. For example, the substrates 102, 102' may be made of bulk Si, sapphire, trap-rich Si, high-resistivity Si, gallium arsenide, and various glasses, but a wide variety of other materials have been used as substrates and may be suitable for particular applications (further, as noted above, the substrates 102, 102' may be of different types). As another example, in some IC structures, such as those made using bulk Si substrates, the BOX layer 106 and/or 106' may be omitted.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 8:
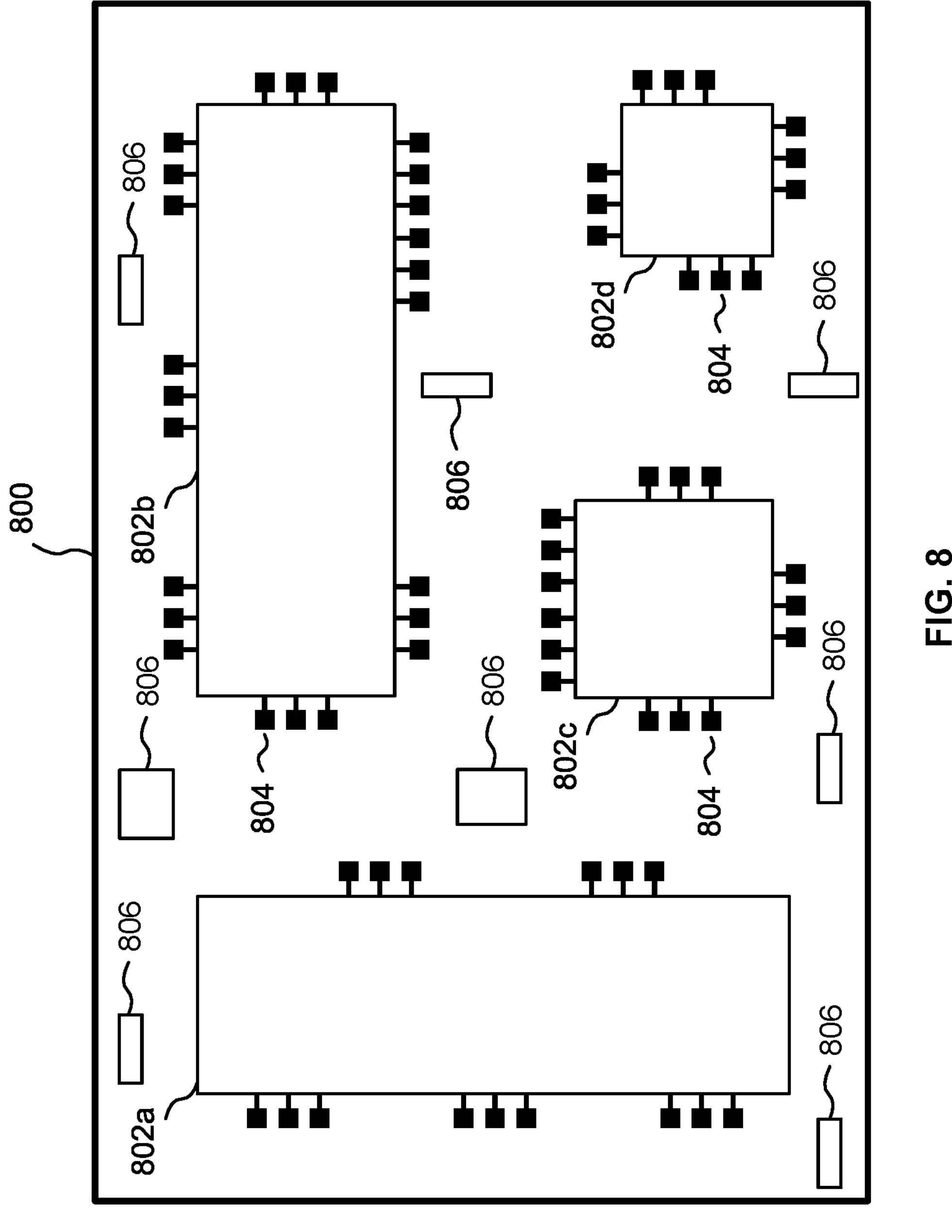
FIG. 8 is a top plan view of a substrate that may be, for example, a printed circuit board or chip module substrate (e.g., a thin-film tile).

As one example of further integration of embodiments of the present invention with other components, FIG. 8 is a top plan view of a substrate 800 that may be, for example, a printed circuit board or chip module substrate (e.g., a thin-film tile). In the illustrated example, the substrate 800 includes multiple ICs 802*a*-802*d* having terminal pads 804 which would be interconnected by conductive vias and/or traces on and/or within the substrate 800 or on the opposite (back) surface of the substrate 800 (to avoid clutter, the surface conductive traces are not shown and not all terminal pads are labelled). The ICs 802*a*-802*d* may embody, for example, signal switches, active filters, amplifiers (including one or more LNAs), and other circuitry. For example, IC 802*b* may incorporate one or more instances of a 3-D IC structure in accordance with the present invention that includes a 3-D resistor configuration comprising disjointed polysilicon segments spaced by an IC substrate and connected by conductive TSVs.

The substrate 800 may also include one or more passive devices 806 embedded in, formed on, and/or affixed to the substrate 800. While shown as generic rectangles, the passive devices 806 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 800 to other passive devices 806 and/or the individual ICs 802*a*-802*d*. The front or back surface of the substrate 800 may be used as a location for the formation of other structures.

System Aspects

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

As discussed above, the current invention reduces the footprint of ICs that include polysilicon resistors without compromising performance and while maintaining low parasitic capacitance. As a person of ordinary skill in the art will understand, a system architecture is beneficially impacted by the current invention in critical ways.

Methods

Figure 9:
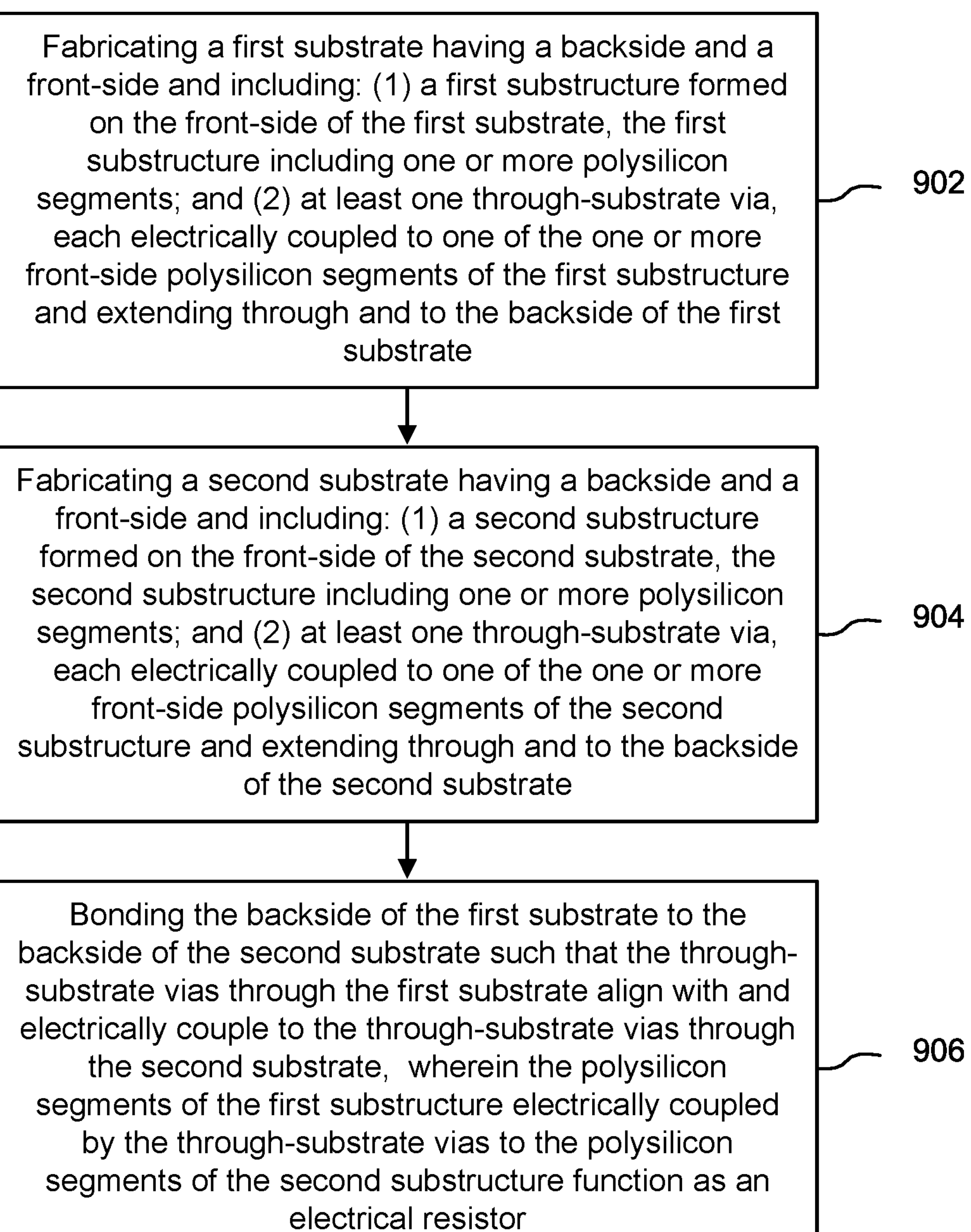
FIG. 9 is a process flow chart showing a first method for making a 3-D IC structure.

Another aspect of the invention includes methods for making a 3-D IC structure having a polysilicon resistor. For example, FIG. 9 is a process flow chart 900 showing a first method for making a 3-D IC structure. The method includes: fabricating a first substrate having a backside and a front-side and including: (1) a first substructure formed on the front-side of the first substrate, the first substructure including one or more polysilicon segments; and (2) at least one through-substrate via, each electrically coupled to one of the one or more front-side polysilicon segments of the first substructure and extending through and to the backside of the first substrate (Block 902); fabricating a second substrate having a backside and a front-side and including: (1) a second substructure formed on the front-side of the second substrate, the second substructure including one or more polysilicon segments; and (2) at least one through-substrate via, each electrically coupled to one of the one or more front-side polysilicon segments of the second substructure and extending through and to the backside of the second substrate (Block 904); and bonding the backside of the first substrate to the backside of the second substrate such that the through-substrate vias through the first substrate align with and electrically couple to the through-substrate vias through the second substrate, wherein the polysilicon segments of the first substructure electrically coupled by the through-substrate vias to the polysilicon segments of the second substructure function as an electrical resistor (Block 906).

Figure 10:
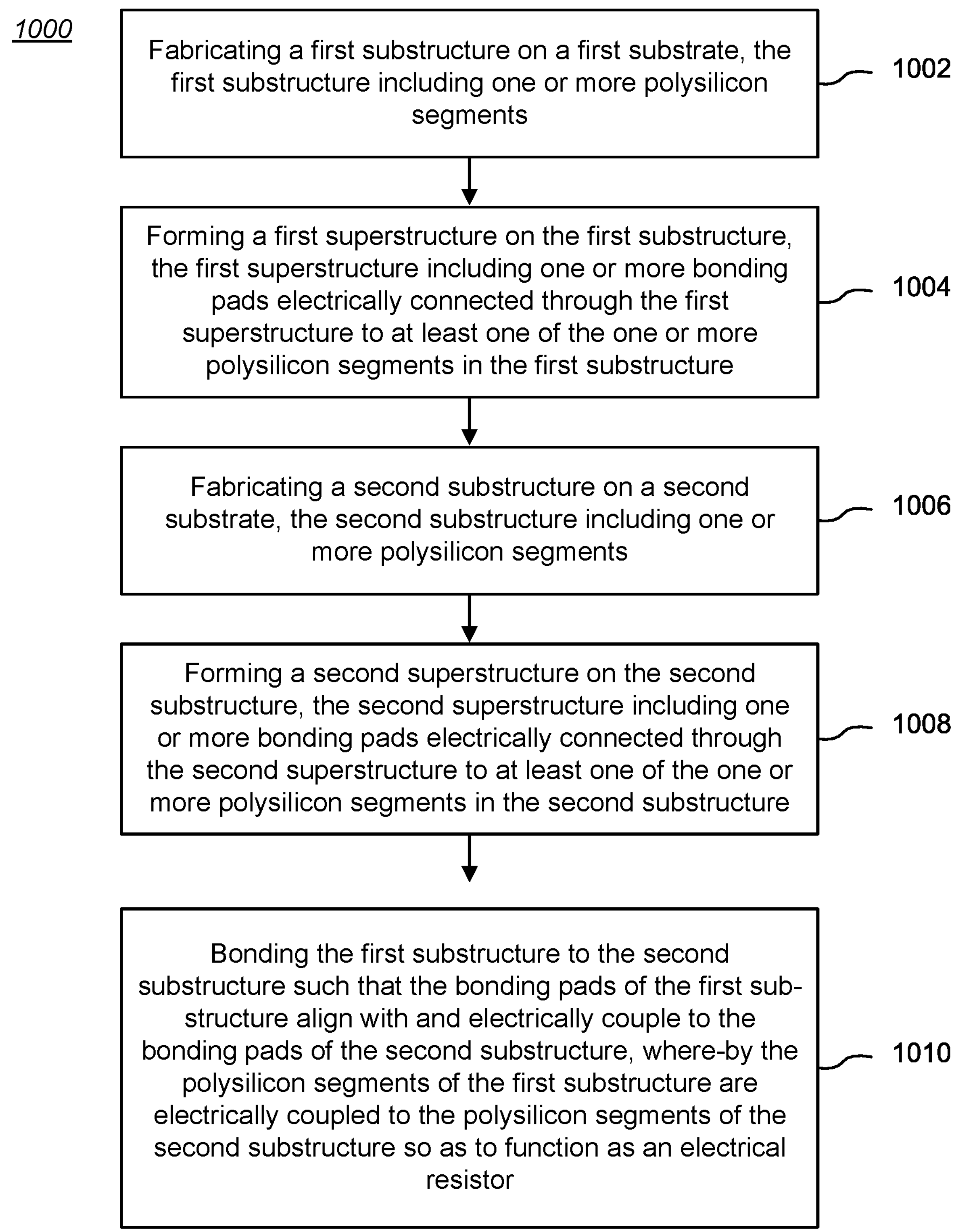
FIG. 10 is a process flow chart showing a second method for making a 3-D IC structure.

As another example, FIG. 10 is a process flow chart 1000 showing a second method for making a 3-D IC structure. The method includes: fabricating a first substructure on a first substrate, the first substructure including one or more polysilicon segments (Block 1002); forming a first superstructure on the first substructure, the first superstructure including one or more bonding pads electrically connected through the first superstructure to at least one of the one or more polysilicon segments in the first substructure (Block 1004); fabricating a second substructure on a second substrate, the second substructure including one or more polysilicon segments (Block 1006); forming a second superstructure on the second substructure, the second superstructure including one or more bonding pads electrically connected through the second superstructure to at least one of the one or more polysilicon segments in the second substructure (Block 1008); and bonding the first substructure to the second substructure such that the bonding pads of the first substructure align with and electrically couple to the bonding pads of the second substructure, whereby the polysilicon segments of the first substructure are electrically coupled to the polysilicon segments of the second substructure so as to function as an electrical resistor (Block 1010).

Figure 11:
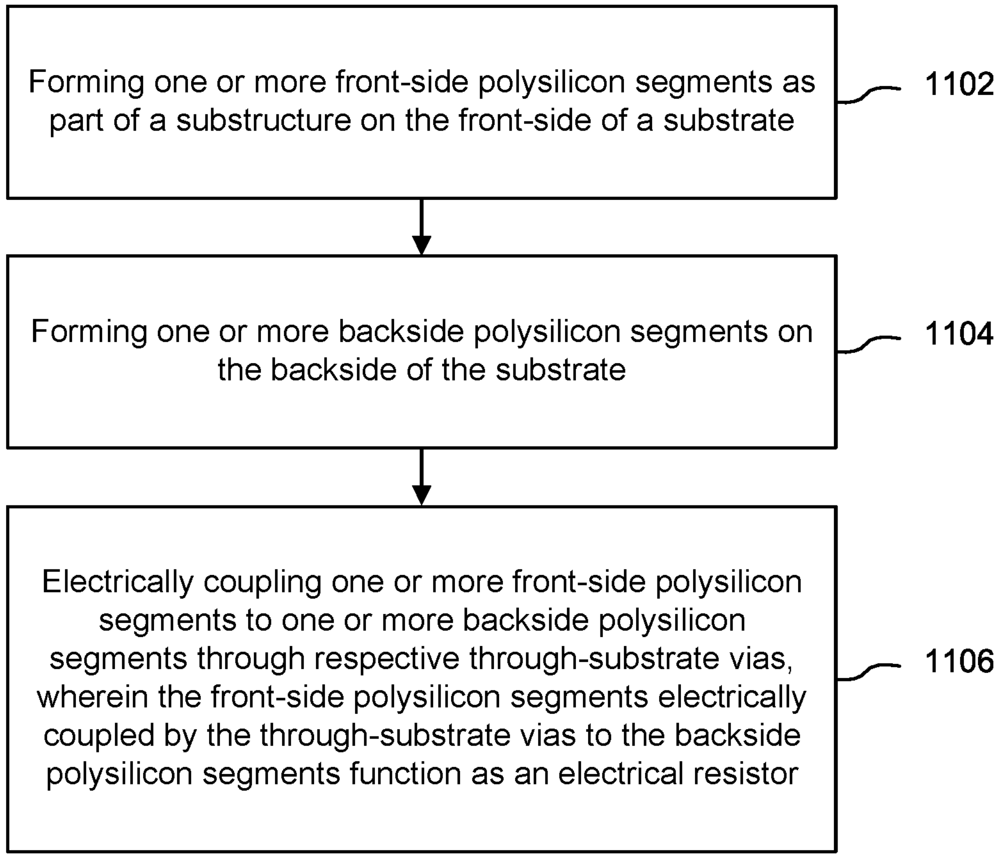
FIG. 11 is a process flow chart showing a third method for making a 3-D IC structure.

As yet another example, FIG. 11 is a process flow chart 1100 showing a third method for making a 3-D IC structure. The method includes: forming one or more front-side polysilicon segments as part of a substructure on the front-side of a substrate (Block 1102); forming one or more backside polysilicon segments on the backside of the substrate (Block 1104); and electrically coupling one or more front-side polysilicon segments to one or more backside polysilicon segments through respective through-substrate vias, wherein the front-side polysilicon segments electrically coupled by the through-substrate vias to the backside polysilicon segments function as an electrical resistor (Block 1106).

Any of the above methods may include additional steps to form the polysilicon resistor configurations shown in any of FIG. 6A-6G or 7.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawing pages, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar junction transistors (BJT), BICMOS, LDMOS, BCD, GaAs HBT, GaN HEMT, GaAs pHEMT, MESFET, InP HBT, InP HEMT, FinFET, GAAFET, and SiC-based power device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A three-dimensional integrated circuit structure including at least two disjointed polysilicon resistor segments spaced by a pair of bonded integrated circuit substrates and electrically connected by at least one through-substrate via.

2. The three-dimensional integrated circuit structure of claim 1, further including a first electrical contact electrically coupled to a first end polysilicon segment of the at least two disjointed polysilicon resistor segments, and a second electrical contact electrically coupled to a second end polysilicon segment of the at least two disjointed polysilicon resistor segments.

3. The three-dimensional integrated circuit structure of claim 2, further including:

(a) a first electrical contact electrically coupled to a first end polysilicon segment of the at least two disjointed polysilicon resistor segments;

(b) a second electrical contact electrically coupled to a second end polysilicon segment of the at least two disjointed polysilicon resistor segments; and (c) at least one additional electrical contact electrically coupled to an associated segment of the at least two disjointed polysilicon resistor segments at a connection point located along a current path between the first electrical contact and the second electrical contact.

4. The three-dimensional integrated circuit structure of claim 1, wherein most of the at least two disjointed polysilicon resistor segments are substantially "L" shaped.

5. The three-dimensional integrated circuit structure of claim 1, wherein a first set of the at least two disjointed polysilicon resistor segments are substantially "Z" shaped and a second set of the at least two disjointed polysilicon resistor segments are substantially "I" shaped.

6. The three-dimensional integrated circuit structure of claim 1, wherein a first set of the at least two disjointed polysilicon resistor segments are substantially "Z" shaped and a second set of the at least two disjointed polysilicon resistor segments are substantially "C" shaped.

7. The three-dimensional integrated circuit structure of claim 6, wherein the "C" shaped polysilicon segments at least partially underlap associated ones of the "Z" shaped polysilicon segments.

8. The three-dimensional integrated circuit structure of claim 1, wherein the pair of bonded integrated circuit substrates comprises a first substrate formed of a first material and a second substrate formed of a second material different from the first material.

9. The three-dimensional integrated circuit structure of claim 1, wherein each of the pair of bonded integrated circuit substrates has a front-side including a substructure and a backside, and wherein the pair of bonded integrated circuit substrates are bonded at their respective backsides such that the disjointed polysilicon resistor segments are disposed on opposing outward-facing front-sides of the three-dimensional integrated circuit structure.

10. The three-dimensional integrated circuit structure of claim 1, wherein the at least one through-substrate via comprises a first via segment extending through the first substrate and a second via segment extending through the second substrate, and wherein the first and second via segments are aligned and electrically coupled at a bonding interface between the pair of bonded integrated circuit substrates.

11. The three-dimensional integrated circuit structure of claim 1, wherein at least one of the pair of bonded integrated circuit substrates comprises a trap-rich silicon layer or a high-resistivity silicon substrate.

12. A three-dimensional integrated circuit structure comprising:

a pair of integrated circuit substrates comprising a first integrated circuit substrate and a second integrated circuit substrate, each of the integrated circuit substrates having a front-side including a substructure and a backside, the pair of integrated circuit substrates being bonded at their respective backsides;

wherein a plurality of disjointed polysilicon resistor segments comprising a first polysilicon resistor segment disposed on a front-side of the first integrated circuit substrate and a second polysilicon resistor segment disposed on a front-side of the second integrated circuit substrate, and at least one through-substrate via electrically connected between the first polysilicon resistor segment and the second polysilicon resistor segment.

13. The three-dimensional integrated circuit structure of claim 12, wherein the first polysilicon resistor segment and the second polysilicon resistor segment are spaced apart by the pair of bonded integrated circuit substrates.

14. The three-dimensional integrated circuit structure of claim 12, wherein the at least one through-substrate via comprises a first via segment extending through the first integrated circuit substrate and a second via segment extending through the second integrated circuit substrate, and wherein the first and second via segments are aligned and electrically coupled at a bonding interface between the pair of integrated circuit substrates.

* * * * *